United States Patent

[11] 3,628,171

[72] Inventors Kaneyuki Kurokawa
Murray Hill;
Frank Matthieu Magalhaes, Berkeley Heights, both of N.J.

[21] Appl. No. 61,913
[22] Filed Aug. 7, 1970
[45] Patented Dec. 14, 1971
[73] Assignee Bell Telephone Laboratories, Incorporated
Murray Hill, N.J.

[54] MICROWAVE POWER COMBINING OSCILLATOR CIRCUITS
10 Claims, 6 Drawing Figs.

[52] U.S. Cl. .......... 331/56, 331/96, 331/107 R
[51] Int. Cl. .......... H03b 7/14
[50] Field of Search .......... 331/46, 56, 96, 97, 101, 107 R; 333/83 A

[56] References Cited

UNITED STATES PATENTS

| | | | |
|---|---|---|---|
| 3,189,843 | 6/1965 | Bruck | 331/107 T |
| 3,416,095 | 12/1968 | Earl, Jr. et al. | 331/97 X |
| 3,534,293 | 10/1970 | Harkless | 331/96 X |

*Primary Examiner*—Roy Lake
*Assistant Examiner*—Siegfried H. Grimm
*Attorneys*—R. J. Guenther and Arthur J. Torsiglieri

ABSTRACT: A microwave power combining oscillator circuit comprises a plurality of coaxial cables each having a negative resistance diode mounted at one end and a matching dissipative impedance connected across the other end. A midportion of each coaxial cable inner conductor extends along a side of a rectangular cavity resonator. With the inner conductors symmetrically spaced a half wavelength apart along opposite sides of the resonator, the oscillatory outputs of the diodes are combined at a single frequency and transmitted by an output waveguide.

INVENTORS
K. KUROKAWA
F. M. MAGALHAES
BY
Roderick B. Anderson
ATTORNEY

MICROWAVE POWER COMBINING OSCILLATOR CIRCUITS

BACKGROUND OF THE INVENTION

This relates to oscillator circuits, and more particularly, to circuits for combining the output powers of a plurality of negative resistance microwave generators.

Probably the most promising solid-state microwave source is the negative resistance avalanche diode known as the IMPATT diode. Various forms of this device are described, for example, in the patent of Read U.S. Pat. No. 2,899,652; the paper "The IMPATT Diode—A Solid-State Microwave Generator" *Bell Laboratories Record*, by K. D. Smith, Vol. 45, May 1967, page 144; the paper "Microwave Si Avalanche Diode With Nearly Abrupt Type Junction" by T. Misawa, *IEEE Transactions on Electron Devices*, Vol. ED–14, Sept. 1967, page 580; and the patent of B. C. De Loach, Jr., et al. U.S. Pat. No. 3,270,293. As with all solid-state microwave generating devices, the design of the IMPATT diode requires a compromise between power and frequency; as the frequency requirements increase, the power capabilities decrease. The desirability of combining the outputs of a plurality of such devices has therefore been evident for some time; see, for example, the patents of Josenhans et al. U.S. Pat. No. 3,460,055 and Schlosser, U.S. Pat. No. 3,516,008.

The principal difficulty in combining the outputs of a plurality of negative resistance devices such as IMPATT diodes is caused by the large frequency bandwidth over which negative resistance can be obtained. If several such diodes are connected to a common resonator, they are capable of supporting oscillations at any of a number of frequencies and therefore tend to operate in spurious oscillatory modes; this phenomenon is known as moding. The various schemes that have been proposed for overcoming the moding problem usually require fairly complex structures. For example, a separate resonator may be used with each diode to provide a narrow band output; circuits may be used for shifting the frequencies of spurious modes; attenuating means may be placed at strategic locations in the resonant circuit.

SUMMARY OF THE INVENTION

We have found that the outputs of a large plurality of negative resistance devices such as IMPATT diodes may be combined by making use of the coupling arrangement described in the U.S. Pat. of E. T. Harkless, No. 3,534,293 granted Oct. 13, 1970. The Harkless patent teaches that the IMPATT diode may be coupled to a resonator by mounting the diode on one end of a coaxial cable that is terminated at the other end by a matched impedance. A midportion of the cable is coupled to the resonator which in turn is coupled to an output transmission line. In accordance with our invention, a plurality of such coaxial cables, each connected to a negative resistance diode, are coupled to a common resonator to give a combined power output that is delivered by a single output transmission line.

The coaxial cables are preferably coupled to opposite sides of the resonator at successive half wave lengths. We have found that dependable frequency stability with as many as 20 to 30 diodes can be obtained by providing that the positive impedance seen by each diode is equal to the negative impedance of that diode. When this condition obtains, as will be described more completely later, the design of the coupling aperture between the coaxial cable and the resonator is not critical, as was implied in the Harkless patent. In fact, for simplicity of construction, it is preferred that each coaxial cable be coupled to the resonator merely by extending the cable inner conductor between top and bottom walls of the resonator.

These and other objects, features, and advantages of the invention will be better understood from a consideration of the following detailed description taken in conjunction with the accompanying drawing.

DRAWING DESCRIPTION

DETAILED DESCRIPTION

The idea of combining the output powers of a plurality of oscillators by coupling them to a single resonator is now new. The patent of Zottu, U.S. Pat. No. 2,177,272, shows a number of triode oscillators coupled to a coaxial resonator which in turn is connected to a load. More recently, solid-state microwave repeater systems using such power combiners have been sold commercially. This type of device is illustrated in FIG. 1 and comprises four transistor oscillators coupled to a coaxial resonator.

Figure 1:
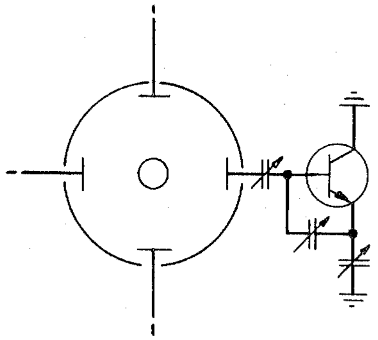
FIG. 1 (PRIOR ART)
FIG. 1 is a schematic illustration of a power combining oscillator circuit of the prior art.

While the circuit of FIG. 1 is operative, problems are encountered if one attempts to use the same scheme for combining the outputs of several negative resistance diode oscillators such as IMPATT diode oscillators. In addition to the desired mode of oscillation, for which the *r–f* currents through all the devices are in phase, as indicated by the solid arrows in FIG. 2, several undesirable modes of oscillation become possible and inevitably occur. For example, the combined oscillator may oscillate in a mode for which the *r–f* currents through two of the diodes are out of phase relative to those through the remaining two diodes, as indicated by the dotted arrows of FIG. 2. In the case of N diodes symmetrically mounted to a cavity, there are at least N−1 such undesirable modes of oscillation, all of which have essentially the same probability of occurring. To make matters worse, a small variation of the operating point of the devices or a small variation in the loading condition or even the environmental temperature may cause the combined oscillator to repeatedly change oscillatory modes, giving objectionable instability in the frequency as well as in the output power. This is the well-known moding problem referred to above.

Figure 2:
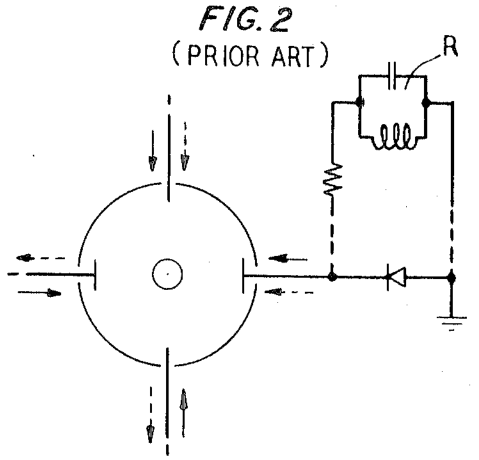
FIG. 2 (PRIOR ART)
FIG. 2 is a schematic illustration of another power combining oscillator circuit of the prior art.

The reason that the transistor oscillator power combiner of FIG. 1 works, while that of FIG. 2 does not, is that the active frequency range over which each individual transistor shows a negative resistance is narrow, being determined by the feedback circuit around it. Consequently, the frequencies for all undesired modes can be placed outside the active frequency range of the transistor bandwidth. On the other hand, negative resistance devices such as IMPATT diodes show a negative resistance over a wider frequency rage, often much wider than an octave. Moreover, the operating frequency of IMPATT diodes is typically much higher than for transistors, so that the electrical length from the combining resonator to each diode is longer. As a result, it is difficult to remove the frequencies of the undesired modes to values outside the active frequency range of the diodes.

One solution is to attach a stabilizing resonator R to each diode as shown by the dotted lines of FIG. 2. This, of course, would require the use of as many resonant circuits as the number of diodes, in addition to the power combining resonator. In accordance with our invention, this requirement is avoided in a structurally uncomplicated embodiment illustrated in FIGS. 3, 4, and 5.

Figure 3:
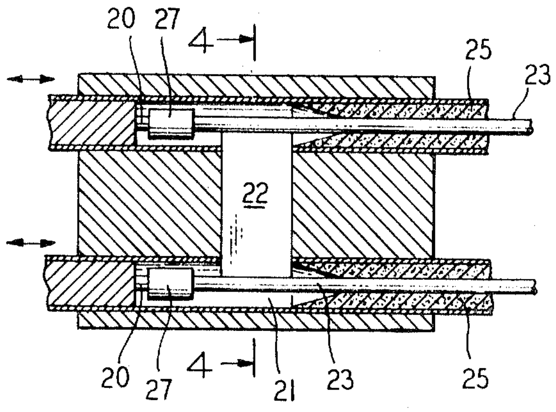
FIG. 3 is a schematic drawing of a power combining oscillator circuit in accordance with the present invention.
Figure 4:
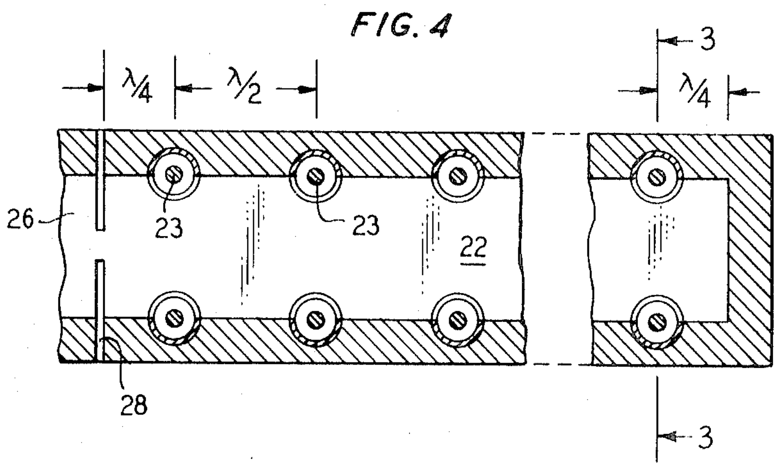
FIG. 4 is a view taken along lines 4—4 of FIG. 3.

As shown in FIG. 3, the outputs of a plurality of negative resistance diodes 20 are coupled by coaxial cables 21 to a common combining resonator 22. Each of the coaxial cables comprises an inner conductor 23 which extends along one side wall of the resonator 22 as shown in FIG. 4. Included at the end of each coaxial cable opposite the diode is a matched dissipative impedance 25; that is, the impedance of dissipative impedance 25 is equal to the characteristic impedance of the coaxial cable transmission line in which it is included. As shown in FIG. 4, the conductors 23 are symmetrically located on opposite sides of resonator 22 successively separated by a half wavelength at the resonant frequency of the resonator. The resonator 22 is coupled to an output waveguide 26 which transmits the generated oscillatory energy to an appropriate load. The diodes are preferably connected in parallel via conductors 23 to a suitable bias source which, for reasons of brevity and clarity, has not been shown.

Each diode 20 is, of course, constructed to generate fundamental oscillations at the resonant frequency $f$ of the resonator 22. Undesirable moding in the cavity is precluded because of the tendency of unwanted frequency components to be dissipated by dissipative impedances 25 and because each diode is impedance matched to the circuit which it respectively sees. The circuit positive impedance seen by each diode is made to be substantially equal to the magnitude of the negative impedance of that diode by the inclusion of a transformer 27 in each inner conductor adjacent the diode. Methods for determining diode impedance, circuit impedance, and for proper construction of each transformer are matters involving ordinary skill in the art and will therefore not be recounted.

Both the output waveguide 26 and the resonator 22 are rectangular in shape and constructed to support oscillatory energy in the $TE_{01}$ mode. More specifically, resonator 22 oscillates in the $TE_{01n}$ resonator mode where $n$ is equal to the number of pairs of diodes whose outputs are being combined in accordance with the illustrated embodiment. With this construction and with the separation shown in FIG. 4, each inner conductor 23 is located at a location of substantially zero electric field. Precise locating of the inner conductors at these points is not essential for the combining operation, but it does facilitate the circuit adjustment. For example, it may be possible to locate two conductors 23 close together on opposite sides of a maximum magnetic field point for increasing the number of combining diodes.

Notice that there is no unique coupling aperture between each coaxial cable and the combining resonator 22; rather, semicylindrical grooves are cut in opposite walls of the resonator to define outer conductor portions of the cable, with each corresponding inner conductor portion being entirely exposed as it extends through the resonator. We have found that proper IMPATT diode operation, when so coupled to the resonator, requires only proper impedance matching to the external circuit, rather than any particular form of coupling. Fine impedance matching of each individual diode is accomplished after each diode has been mounted by moving it on a movable mount as shown by the arrows of FIG. 3. That is, each diode is individually operated and moved axially until its output through waveguide 26 is maximized at the desired frequency $f$. After this has been accomplished, fine impedance matching of all of the diodes is made by rotating rectangular waveguide 26 on a swivel joint 28 with respect to cavity resonator 22.

Figure 5:
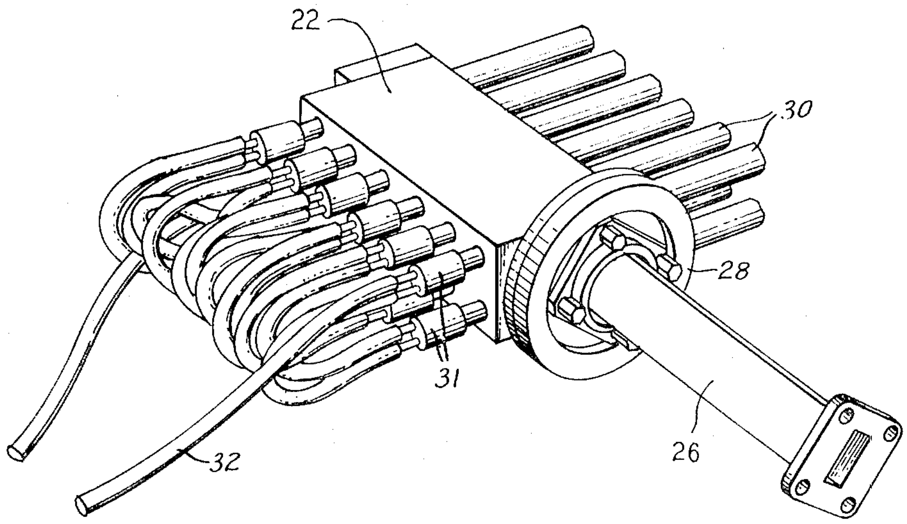
FIG. 5 is a perspective view of the power combining oscillator structure of FIGS. 3 and 4.

The rotated orientation of the output waveguide with respect to the resonator is evident in the perspective view of an experimental version of the device shown in FIG. 5. Of course, since the angle between electric fields in the resonator and the waveguide changes as the output waveguide is rotated, the coupling between them changes as does the output impedance seen by the diode array. Microwave impedance matching not only enhances output power at the frequency $f$, but is also important for preventing moding, in accordance with the invention. Termination holders 30, of course, support the dissipative impedances 25 of FIG. 3, while diode holders 31 support the diodes 20. A tubulation 32 transmits water to the diode holders for cooling during operation as is known in the art.

The experimental power combining device illustrated in FIGS. 3 through 5 has been successfully built and operated and included 12 V-package IMPATT diodes. 10.5 watts of continuous wave output power at 9.1 gigaHertz was obtained under the conservative operation recommended by device engineers for long diode life. No spurious oscillations were observed during circuit adjustment and operation. The adjustment was extremely easy and the spectrum of the output was clean. Circuit measurements show that up to approximately 32 diodes can be coupled to the combining resonator 22 without additional means of mode suppression. Even more diodes could be used by changing the Q of the resonator, inserting a mode suppressor such as thin resistive film in the cavity, or using a pair of coaxial cables symmetrically located about each maximum magnetic field point.

Figure 6:
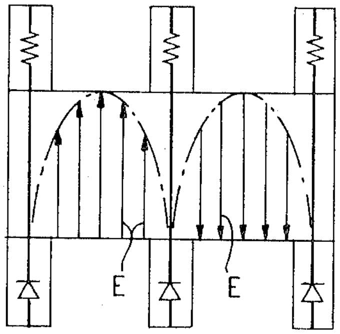
FIG. 6 is a schematic illustration of a power combining structure in accordance with another embodiment of the invention.

Another possibility for increasing the number of diodes is to use a resonator that operates in the $TE_{02}$ mode as shown in FIG. 6. The schematic sectional view of FIG. 6 corresponds to the sectional view of FIG. 3. However, since the $TE_{02}$ mode has a null of the electric field E at the center of the resonator as well as at opposite sides, an inner conductor may be extended through the center of the resonator as shown in FIG. 6. This, of course, permits three diodes to be used at each successive half wavelength position.

Various other modifications and embodiments may be made by those skilled in the art without departing from the spirit and scope of the invention. For example, strip transmission lines may be used as alternatives to the coaxial cables of FIGS. 3 and 4, which may be coupled to a strip line resonator. Coupling in this case should be made at locations of maximum electric field as is well understood in the art, for good electric coupling.

What is claimed is:

1. An oscillator circuit comprising:

a plurality of coaxial cable transmission lines comprising inner and outer conductors;

means for generating oscillations of frequency $f$ comprising a negative resistance device connected to one end of the inner conductor of each coaxial cable;

a matched dissipative impedance connected to the other end of each of said inner conductors;

a cavity resonator having a resonant frequency $f$;

means for propagating oscillatory energy to a load comprising an output transmission line coupled to the resonator;

each of said inner conductors extending through the cavity resonator at a location of substantially zero electric field;

means included in each coaxial cable transmission line for matching the output resistance seen by each device to the negative resistance of such device;

and means comprising the resonator and the impedance matching means for selectively combining and for channeling, from each negative resistance device to the output transmission line, oscillatory energy of frequency $f$, while permitting energy of other frequencies to be transmitted to the dissipative impedances.

2. The oscillator circuit of claim 1 wherein:

the output transmission line propagates energy in a first direction;

and the coaxial cable inner conductors extend through the resonator in a second direction transverse to the first direction.

3. The oscillator circuit of claim 2 wherein:

the negative resistance devices are IMPATT diodes.

4. The oscillator circuit of claim 3 wherein:

the dissipative impedance has an impedance substantially equal to the characteristic impedance of the coaxial cable to which it is connected, whereby substantially no energy is reflected by the dissipative impedance.

5. The oscillator circuit of claim 4 wherein:

the impedance matching means comprises a transformer section incorporated in each coaxial cable between the IMPATT diode to which it is connected and the resonator.

6. An oscillator circuit comprising:

a plurality of first transmission lines;

means for generating oscillations at a frequency $f$ comprising a negative resistance device mounted at one end of each first transmission line;

a matched dissipative impedance connected to the other end of each first transmission line;

a cavity resonator having a resonant frequency $f$;

means for propagating oscillatory energy to a load comprising a second transmission line coupled to the resonator;

the first transmission line being coupled to the resonator at either of two opposite sides of the resonator at successive locations separated by approximately one-half wavelength at the frequency $f$;

means for matching the output impedance seen by each negative resistance device to the negative resistance of such device comprising a transformer included in each first transmission line;

and means comprising the resonator and the transformer means for selectively combining and for channeling, from each negative resistance device to the second transmission line, oscillatory energy of frequency $f$, while permitting energy of other frequencies to be transmitted to the dissipative impedances.

7. The oscillator circuit of claim 6 wherein:

the first transmission lines are coaxial cables.

8. The oscillator circuit of claim 6 wherein:

the impedance matching means comprises means for moving each negative resistance device axially within its respective first transmission line.

9. The oscillator circuit of claim 8 wherein:

the resonator oscillates in the $TE_{01n}$ mode, where $n$ is the number of negative resistance devices;

the second transmission line propagates energy in the $TE_{01}$ mode;

and the impedance matching means further comprises means for rotating the second transmission line with respect to the resonator.

10. The oscillator circuit of claim 9 wherein: the negative resistance devices are IMPATT diodes.

* * * * *